(12) United States Patent
Gowda

(10) Patent No.: US 12,034,033 B2
(45) Date of Patent: Jul. 9, 2024

(54) SEMICONDUCTOR DEVICE PACKAGE AND METHOD OF FORMING

(71) Applicant: GE AVIATION SYSTEMS LLC, Grand Rapids, MI (US)

(72) Inventor: Arun Virupaksha Gowda, Rexford, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 160 days.

(21) Appl. No.: 17/583,682

(22) Filed: Jan. 25, 2022

(65) Prior Publication Data

US 2023/0238423 A1 Jul. 27, 2023

(51) Int. Cl.
*H01L 23/373* (2006.01)
*H01L 23/00* (2006.01)
*H01L 49/02* (2006.01)

(52) U.S. Cl.
CPC .......... *H01L 28/20* (2013.01); *H01L 23/3735* (2013.01); *H01L 24/20* (2013.01); *H01L 2224/214* (2013.01); *H01L 2924/10272* (2013.01); *H01L 2924/1207* (2013.01); *H01L 2924/13091* (2013.01)

(58) Field of Classification Search
CPC .......... H01L 23/3735; H01L 23/49827; H01L 23/62; H01L 23/647; H01L 24/20; H01L 28/20

See application file for complete search history.

(56) References Cited

U.S. PATENT DOCUMENTS

| | | |
|---|---|---|
| 4,920,388 A | 4/1990 | Blanchard et al. |
| 5,506,421 A | 4/1996 | Palmour |
| 7,042,074 B2 | 5/2006 | Gobl et al. |
| 7,695,997 B2 | 4/2010 | Shimoida et al. |
| 8,011,296 B2 | 9/2011 | Sandhu et al. |
| 8,324,686 B2 | 12/2012 | Willmeroth et al. |
| 9,966,334 B2 | 5/2018 | Sawada |
| 10,566,324 B2 | 2/2020 | Losee et al. |
| 10,804,116 B2 | 10/2020 | Kapusta et al. |
| 2005/0151249 A1 | 7/2005 | Eckstein et al. |
| 2006/0267135 A1 | 11/2006 | Wolfgang et al. |
| 2009/0072379 A1 | 3/2009 | Ewe et al. |
| 2016/0079221 A1 | 3/2016 | Inokuchi et al. |
| 2018/0337171 A1 | 11/2018 | Losee et al. |
| 2019/0237416 A1* | 8/2019 | Gao .................. H01L 23/49827 |
| 2020/0044064 A1 | 2/2020 | Weyers et al. |

FOREIGN PATENT DOCUMENTS

| | | |
|---|---|---|
| DE | 102004061908 A1 | 7/2006 |
| JP | 2002083964 A | 3/2002 |
| JP | 2005167241 A | 6/2005 |

(Continued)

*Primary Examiner* — Brook Kebede
(74) *Attorney, Agent, or Firm* — McGarry Bair PC

(57) ABSTRACT

A semiconductor device package comprises a semiconductor switching device having a body, including a first side, and an opposing second side coupled to a substrate. A gate terminal is defined on the semiconductor switching device body first side, the gate terminal having a first side, and an opposing second side facing the semiconductor switching device body. A first gate resistor is disposed on the gate terminal first side, and coupled electrically in series with the gate terminal.

20 Claims, 3 Drawing Sheets

(56) References Cited

FOREIGN PATENT DOCUMENTS

| | | | | |
|---|---|---|---|---|
| JP | 2006140193 | A | 6/2006 | |
| JP | 2016082039 | A | 5/2016 | |
| JP | 6514338 | B2 * | 5/2019 | ........... H01L 21/822 |
| WO | WO-2013006699 | A2 * | 1/2013 | ......... H01L 27/0629 |
| WO | 2017029748 | A1 | 2/2017 | |

* cited by examiner

SEMICONDUCTOR DEVICE PACKAGE AND METHOD OF FORMING

BACKGROUND

Power conversion devices, such as silicon carbide (SiC) power devices, are widely used in conventional electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors).

The switching behavior of conventional power semiconductor switching devices (e.g., MOSFETs) is controlled by a gate capacitance recharge. The gate capacitance recharge is often controlled via a gate resistor arranged in series with the gate terminal of the switching device. The dynamic switching performance (e.g., switching speed) of the semiconductor switching device can be adjusted based on the value of the gate resistor. The gate resistor can influence many other dynamic performance characteristics of the semiconductor switching device including switching losses, reverse bias safe operating area, and short-circuit safe operating area.

DETAILED DESCRIPTION

Figure 1:
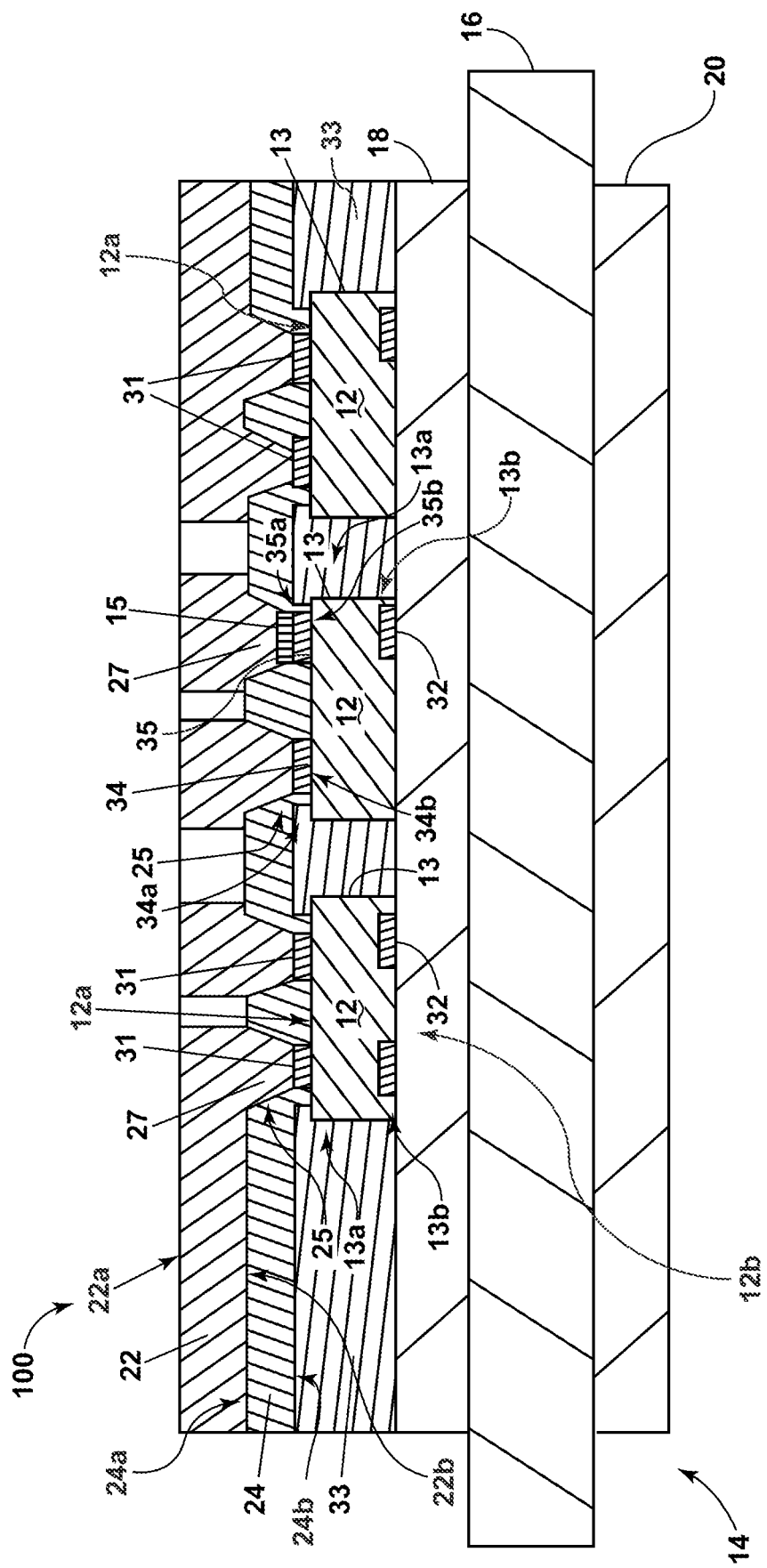
FIG. 1 is a cross-sectional view of a semiconductor device package in accordance with various aspects described herein.

Aspects of the disclosure can be implemented in any environment, apparatus, or method for semiconductor device package regardless of the function performed by the semiconductor device.

As used herein, the term "set" or a "set" of elements can be any number of elements, including only one. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one aspect" or "an aspect" of the present disclosure are not intended to be interpreted as excluding the existence of additional aspects that also incorporate the recited features. It may be appreciated that the shapes, positions, and alignments of features presently disclosed are, for the sake of simplicity, illustrated and described as being relatively ideal (e.g., square, rectangular, and hexagonal depicted with perfectly straight and aligned features). However, as may be appreciated by one of skill in the art, process variations and technical limitations may result in designs with less than ideal shapes or irregular features may still be in accordance with the present disclosure.

Additionally, while terms such as "voltage", "current", and "power" can be used herein, it will be evident to one skilled in the art that these terms can be interrelated when describing aspects of the electrical circuit, or circuit operations.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Additionally, as used herein, "electrical connection" or "electrically coupled" can include a wired or wireless connection. The exemplary drawings are for purposes of illustration only and the dimensions, positions, order and relative sizes reflected in the drawings attached hereto can vary.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

Conventional semiconductor device packages such as, power overlay modules (POLs), for example, typically include a set of semiconductor devices (e.g., MOSFETs) having conductive contacts on two opposing sides (e.g., a top side and a bottom side, respectively). The bottom side of the semiconductor devices are soldered to one side (e.g., a top side) of a-metal insulated substrate layer (e.g., a direct bond copper (DBC) substrate). A dielectric layer is disposed on the top side of the semiconductor devices and may be coupled to the devices using an adhesive. A metallization layer or conductive layer is typically deposited on top of the dielectric layer and through vias or apertures defined in the dielectric layer, to thereby enable electrical connection of the metallization layer to the top side of the semiconductor devices therethrough through the dielectric layer.

For example, the semiconductor device can typically comprise a MOSFET, having a source terminal and a gate terminal formed on the semiconductor device top side. Conventional semiconductor devices can be manufactured with an "in-chip" internal gate resistance arranged within the semiconductor device chip, and is coupled via a conductive line arranged within the semiconductor device chip to the gate terminal. However, in many cases, different values of gate resistance can be desired depending on the specific application or end-use of the semiconductor device. This is typically addressed by semiconductor chip manufacturers by defining multiple MOSFET chips, each having a different respective gate resistance value, and each having a different respective part number. However, this approach requires a different mask process for each chip, and an increased cost associated with carrying of additional part numbers, inventory, and so on. In some cases, semiconductor device manufacturers have addressed this challenge by adding a discrete "off-chip" gate resistor per die on the power substrate, or for multiple die, at the gate driver level. For example, a conventional POL module can typically include a discrete gate resistor, arranged "off-chip" or otherwise spaced from the MOSFET. Typically, the metallization layer can be arranged to electrically couple the discrete gate resistor to the gate terminal of the MOSFET. In some conventional arrangements, the discrete gate resistor can be coupled to the gate terminal of the MOSFET via a wire bond or other conductor separate from the metallization layer.

Referring to FIG. 1, a non-limiting aspect of semiconductor device package 10 is shown. The semiconductor device package 10 can include a set of semiconductor devices 12, having a first side 12a (e.g., a top side), and an opposing second side 12b (e.g., a bottom side). The semiconductor devices second side 12b can be coupled to a substrate structure 14 (e.g., on a top side of the substrate structure 14). Each semiconductor device 12 can comprise a body 13 having a first side 13a (e.g., a top side) and an opposing second side 13b (e.g., a bottom side). Each semiconductor device 12 can further include a set of first contact pad(s) 31 disposed on the semiconductor device first side 12a, and a set of second contact pad(s) 32 disposed on the semiconductor device second side 12b. A first gate resistor 15 can be coupled to at least one semiconductor device 12. For example, the first gate resistor 15 can be coupled to a corresponding first contact pad 31 of at least one semiconductor device 12.

In the non-limiting aspect depicted in FIG. 1, the substrate structure 14 can comprise an insulator plate 16 (e.g., disposed between a first conductive layer 18 (e.g., a top layer), and a second conductive layer 20 (e.g., a bottom layer). A dielectric layer 24 can comprise a first side 24a (e.g., a top side) and an opposing second side 24b (e.g., a bottom side). The dielectric layer second side 24b can be disposed on the first side 12a of the semiconductor devices 12. The dielectric layer 24 can define a set of apertures 25 therethrough, extending from the dielectric layer first side 24a to the dielectric layer second side 24b. A metal interconnect layer 22 (e.g., copper traces) can comprise a first side 22a (e.g., a top side), and an opposing second side 22b (e.g., a bottom side), and can be formed and patterned onto the dielectric layer top side 24a. The metal interconnect layer 22 can further extend through the set of apertures 25 to define a set of vias 27.

The semiconductor devices 12 can be in the form of a die, diode, other power electronic device, or a passive device such as a capacitor or resistor. In addition to the set of semiconductor devices 12, aspects of the semiconductor device package 10 can also include any number of additional circuitry components such as, for example, a gate driver (not shown). While FIG. 1 depicts three semiconductor devices 12 in semiconductor device package 10, other aspects are not so limited, and a greater or lesser number of semiconductor devices 12 can be included in the semiconductor device package 10. The semiconductor devices 12 can be attached to the substrate structure 14, such as by way of a soldering process, or an adhesive attachment, or a sintered silver attachment.

In non-limiting aspects, the body 13 can be defined by a die comprising silicon carbide. The semiconductor devices 12 can comprise so-called "vertically-conducting" type semiconductor devices 12 which allow for electrical I/O interconnections to be made via the first contact pads 31 arranged on the semiconductor device first side 13a as well as via the second contact pad 32 arranged on the opposing second side 13b. Depending on the application, the set of first contact pads 31 and the set of second contact pads 32 can operatively couple the semiconductor devices 12 to external circuitry (not shown) via the metal interconnect layer 22 and the first conductive layer 18, respectively, and can be electrically coupled to internal elements within the semiconductor device 12.

For example, in non-limiting aspects, the semiconductor device 12 can comprise a MOSFET semiconductor device 12, and the set of first contact pads 31 can comprise a source terminal 34, and a gate terminal 35. The gate terminal 35 can define an outwardly facing (i.e., with respect to the semiconductor device body 13) first side 35a, and an inwardly facing (i.e., with respect to the semiconductor device body 13) second side 35b opposing the first side 35a. The source terminal 34 can define an outwardly facing first side 34a (i.e., with respect to the semiconductor device body 13), and an inwardly facing second side 34b opposing the first side 34a.

Additionally, spaces or gaps defined between the between the set of semiconductor devices 12, can optionally be filled with a dielectric filler material 33. In various aspects, the dielectric filler material 33 can comprise a polymeric material, such as, for example, an underfill (e.g., capillary underfill or no-flow underfill), encapsulate, silicone, a molding compound, or the like.

The first gate resistor 15 can be disposed directly on one of the first contact pads 31. For example, in non-limiting aspects, the first gate resistor 15 can be defined on the first side 35a of the gate terminal 35. In this sense, the first gate resistor 15 can be disposed in direct contact with the gate terminal 35, and exterior to the semiconductor device body 13. In aspects, the first gate resistor 15 can be in direct contact with the first side 35a of the gate terminal 35. In non-limiting aspects, the first gate resistor 15 can be physically supported by the gate terminal 35. In aspects, the gate terminal 35 can be coupled electrically in series with the first gate resistor 15. In non-limiting aspects, the first gate resistor 15 can have a resistance value in the range from 0.1 ohms to 100 ohms in series with the gate terminal 35.

The first gate resistor 15 can be formed or applied at least partially onto one of the first contact pads 31 by way of a "direct write" type application to form, define, or otherwise structurally dispose the first gate resistor 15 onto first contact pad 31, without adding to or modifying the resistance of the first contact pad 31 itself. For example, the first gate resistor 15 can be applied onto one of the first contact pads 31 using an ink jet or aerosol jet printer type application device, where a resistive material (e.g., a carbon-based material) is accurately deposited or printed over, onto, around, or combinations thereof, one of the first contact pads 31. It is recognized, however, that any combination of jetting, dispensing, laser writing, or printing, may be employed in such a direct writing application.

In other non-limiting aspects, any other suitable additive methods of applying resistive material to define the first gate resistor on the gate terminal 35 can also be used without departing from the scope of the disclosure.

The dielectric layer 24 can be disposed on the first side 13a (e.g., a top side) of the set of semiconductor devices 12. For example, in a non-limiting aspect, an adhesive (not shown) may be used to attach the dielectric layer 24 to the set of semiconductor devices 12. In non-limiting aspects, the dielectric layer 24 can comprise a lamination or a film. In some non-limiting aspects, the dielectric layer 24 can be formed of any of a variety of dielectric materials, such as polytetrafluoroethylene (PTFE), polysulfone materials, another polymer film, such as a liquid crystal polymer (LCP) or a polyimide material, or the like. The dielectric layer 24 can be applied at least partially onto the semiconductor device 12 by way of a "direct write" type application. For example, the dielectric layer 24 may be applied onto the semiconductor device 12 using an ink jet printer type application device, where a dielectric material (e.g., polymer, epoxy, or polyimide) is accurately deposited/printed over, onto, and around the semiconductor device 12 and in the space between the devices. It is recognized, however, that any combination of jetting, dispensing, laser writing, or printing, may be employed in such a direct writing application. In employing a direct writing application technique, areas on the semiconductor device 12 where electrical connection is to be made thereto are left open or exposed, to define the set of apertures 25. A cleaning process using laser, dry or wet processes can be used to further clean the via openings for metallization as required.

The metal interconnect layer 22 can be formed or patterned on the dielectric layer top side 24a. The metal interconnect layer 22 can be directly coupled to the semiconductor devices 12 by way of the set of vias 27. For example, the set of vias 27 can enable an electrical connection by the metal interconnect layer 22 with the first contact pads 31 of the semiconductor devices 12. The vias 27 can be formed or defined at positions corresponding to first contact pads 31 formed on the semiconductor device 12 through which an electrical connection can be made to the semiconductor device 12.

In aspects employing a direct writing application technique, areas on the semiconductor device 12 where a resistor is to be formed thereon can further be left open, that is, via an aperture 25 in the dielectric layer defined or formed corresponding to (e.g., above) the first gate resistor 15. A cleaning process using laser, dry or wet processes can be used to further clean the via openings 25 for metallization as required to enable the metal interconnect layer 22 to extend through the aperture to define a via 27 directly coupled with the first gate resistor 15.

It will be appreciated that in aspects employing an optional adhesive to attach the set of semiconductor devices 12 to the dielectric layer 24, the set of apertures 25 will likewise also extend through the adhesive (not shown). The set of apertures 25 can be arranged to have any desired size and spacing, extending through the dielectric layer 24 or adhesive, or both, to enable an electrical connection from the metal interconnect layer 22 to one or more of the first contact pads 31 of at least one of the semiconductor devices 12. In non-limiting aspects, the metal interconnect layer 22 can comprise copper deposited (e.g., electroplated) onto the dielectric layer 24 and through the set of apertures 25 to enable an electrical connection therethrough, that is, from the metal interconnect layer 22 to the first contact pads 31 of the semiconductor devices 12. The metal interconnect layer 22 can have a low profile (e.g., less than 1000 micrometers thick), planar interconnect structure that provides for formation of I/O connections (not shown) to and from the semiconductor devices 12.

According to one non-limiting aspect, the metal interconnect layer 22 can be formed by way of applying a metal layer or material, such as using a sputtering and electroplating process, and then subsequently patterning the applied metal material into the metal interconnect layer 22 having a desired shape. That is, the metal interconnect layer 22 can be formed by applying a titanium or other suitable adhesion layer and copper seed layer via a sputtering and/or evaporation process, followed by electroplating of additional copper thereon to increase a thickness of the metal interconnect layer 22 and form copper traces. According to another aspect, the metal interconnect layer 22 can be formed by a direct write process, where metallic material is directly written or printed to form interconnects. In non-limiting aspects, the vias 27 may be filled using a via fill material, such as conductive ink, adhesive or paste that is subsequently cured to enhance the electrical, thermal, or mechanical properties of the metal interconnect layer 22. Other additive methods of applying metal interconnects can also be used. In another embodiment, a print and plate process can be used when a thin layer of metal is printed using a metal ink and used as a seed to plate copper, with an electrolytic or electro-less process being used for plating copper, for example.

In non-limiting aspects, the substrate structure 14 can be in the form of an insulated metal substrate (IMS), direct bond copper (DBC) substrate, active metal brazed (AMB) substrate, or printed circuit board (PCB). According to the non-limiting aspect, depicted in FIG. 1, the substrate structure 14 can include the insulator plate 16. In non-limiting aspects, the insulator plate 16 can be formed of a thermally conductive, electrically insulative material such as alumina, aluminum nitride, ceramic, or combinations thereof). In non-limiting aspects, the first conductive layer 18 and second conductive layer 20 can comprise metallic sheet (e.g., a copper sheet). The first conductive layer 18 and second conductive layer 20 can be bonded to opposing sides of the insulator plate 16, for example by a high-temperature joining process. In various aspects, different brazing and direct bond technologies can be employed to form the substrate structure 14 based on, for example, the materials used to form the insulator plate 16 (e.g., alumina or aluminum nitride and silicon nitride, etc). The second conductive layer 20 can be fully or partially exposed to provide efficient heat transfer out from the semiconductor device package 10. While the aspect depicted in FIG. 1 illustrates the substrate structure 14 in the form of a DBC substrate, it is recognized that aluminum or any other suitable metallic material can be used instead of copper as the first conductive layer 18 or the second conductive layer 20, or both. It is further contemplated that a ceramic tile or other suitable insulator could be used instead of alumina to form the insulator plate 16, without departing from the scope of the disclosure.

Figure 2:
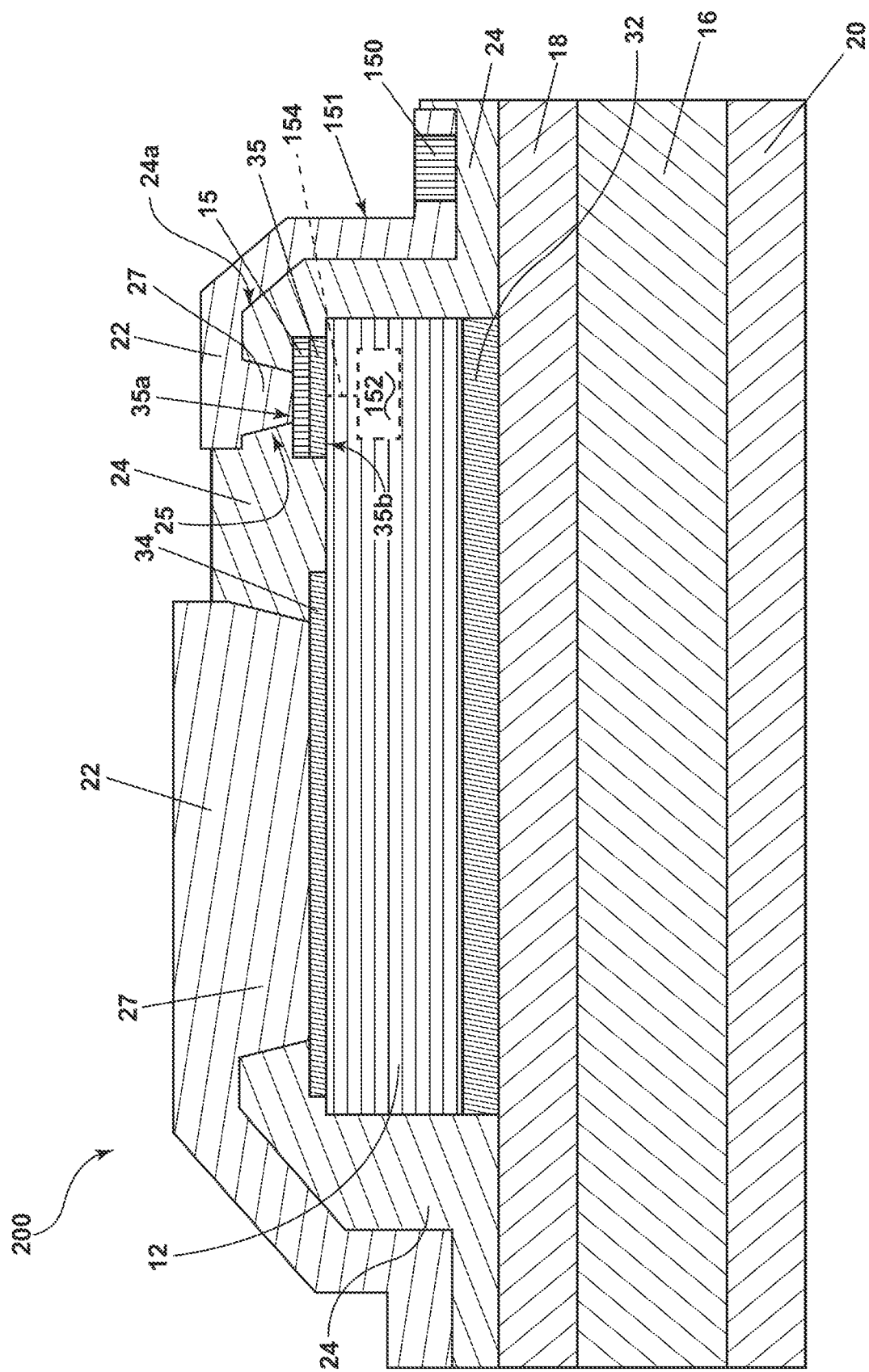
FIG. 2 is a a cross-sectional view of another semiconductor device package accordance with various aspects described herein.

Referring now to FIG. 2, another semiconductor device package 100 is shown in cross-section, according to a non-limiting aspect. The semiconductor device package 200 includes a number of components similar to components shown in the semiconductor device package 100 of FIG. 1, with some parts omitted for clarity, and thus numbers used to indicate components in FIG. 1 will also be used to indicate similar components in FIG. 2.

The semiconductor device package 200 is depicted with semiconductor device 12, coupled to the substrate structure 14 (e.g., on the top side of the substrate structure 14). The first gate resistor 15 is coupled to the semiconductor device 12. The dielectric layer 24 is disposed on the semiconductor device 12 (e.g., on the semiconductor device first side 12a). The dielectric layer 24 can define a set of apertures 25 therethrough. The metal interconnect layer 22 (e.g., copper traces) is formed and disposed onto the dielectric layer first side 24a and through the apertures 25 to define a set of vias 27 therethrough.

Additionally, in non-limiting aspects, the semiconductor device package 200 can include a second gate resistor 150. For example, in non-limiting aspects, the semiconductor device package 200 can include a semiconductor device 12 including a gate terminal 35 electrically coupled in series with the first gate resistor 15 and the second gate resistor 150. The first gate resistor can be defined on the gate terminal 35, and the second gate resistor 150 can be spaced from the gate terminal 35. In aspects, a first conductive line 151 can couple the first gate resistor 15 and the second gate resistor 150 electrically in series. In some aspects, the metal interconnect layer 22 can define the first conductive line 151. In this way, the second gate resistor 150 can be coupled electrically in series with the gate terminal 35 and the first gate resistor 15. In non-limiting aspects the first gate resistor 15 and the second gate resistor 150 can add a total resistance in the range of 0.1 ohms to 100 Ohms in series with the gate terminal 35.

In some non-limiting aspects, as illustrated in FIG. 2, the semiconductor device can further comprise a third gate resistor 152. The third gate resistor can be formed within the semiconductor device body 13. The third gate resistor 152 can further be coupled electrically in series with the first gate terminal 35, using conventional techniques. For example, in non-limiting aspects, the third gate resistor 152 can be coupled to the gate terminal second side via a conductive element 154 defined within the semiconductor device body 13. In some aspects, the third gate resistor 152 can define a segment of the conductive element 154.

The second gate resistor 150 can be applied or disposed at least partially onto the dielectric layer 24 (e.g., a top side of the dielectric layer 24) by way of a "direct write" type application. For example, the second gate resistor 150 can be applied onto the dielectric layer 24 using an ink jet printer type application device, where a resistive material (e.g., a carbon-based material) is accurately deposited or printed over, onto, around, or combinations thereof, a portion of the dielectric layer 24. It is recognized, however, that any combination of jetting, dispensing, laser writing, or printing, may be employed in such a direct writing application.

In other non-limiting aspects, other additive methods of applying resistive material to define the second gate resistor 150 on the dielectric layer 24 can also be used. In another aspect, a print and plate process can be used when a thin layer of a resistive material (e.g., (e.g., a carbon-based material) is printed using a carbon-based ink.

The metal interconnect layer 22 can then be formed or patterned on the dielectric layer 24 and to further define the first conductive line 151 coupled to the second gate resistor 150. In other non-limiting aspects, the second gate resistor 150 can be electrically coupled to the first gate resistor by way of a wire or other conductive line (not shown). In some non-limiting aspects, the second gate resistor can be arranged to define a segment of the first conductive line 151.

Figure 3:
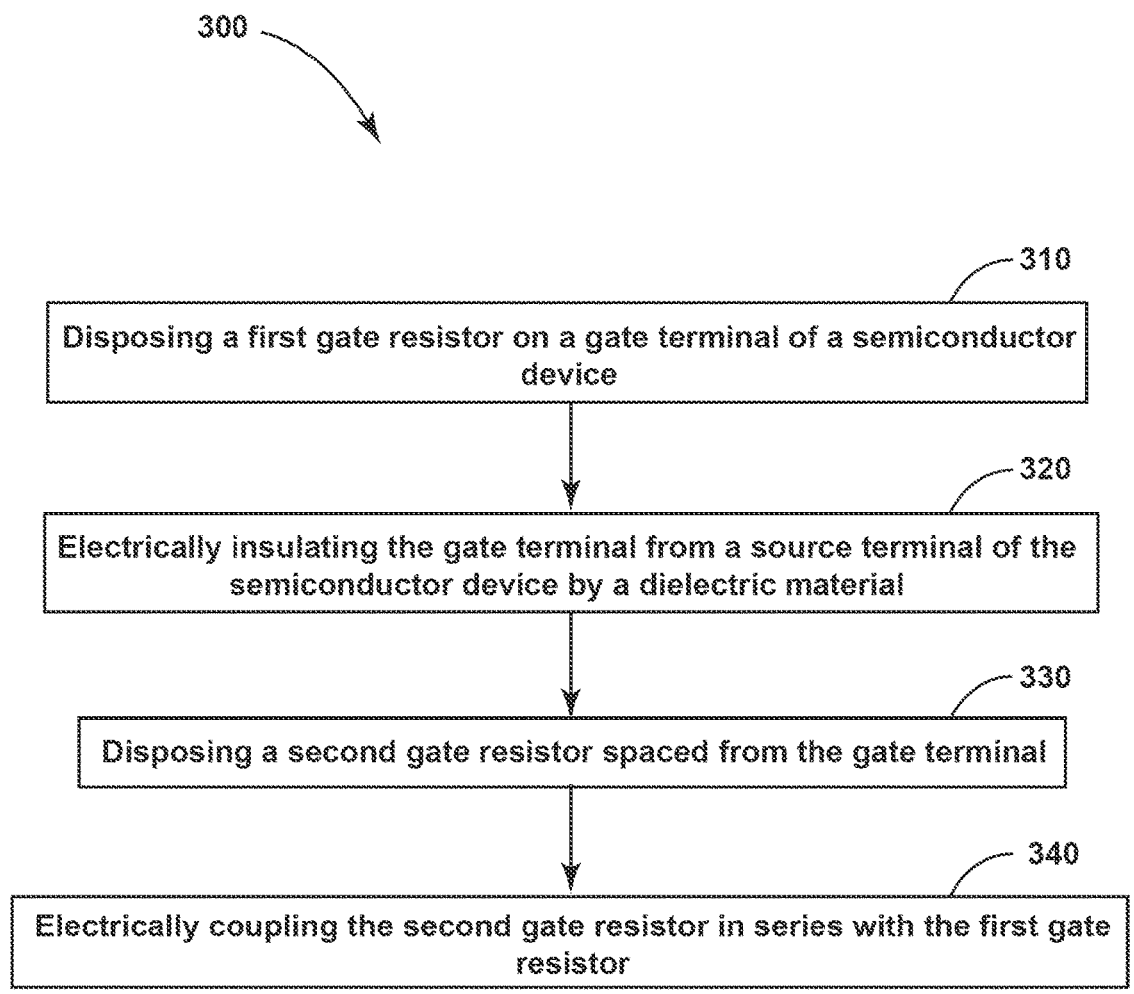
FIG. 3 is an example flow chart diagram of a method of a method a fabricating a semiconductor device package in accordance with various aspects described herein.

FIG. 3 depicts a non-limiting method 300 of forming a semiconductor device package 100, 200 in accordance with various aspects. In non-limiting aspects, a semiconductor switching device 12, comprising a body 13. The body 13 can be defined by a die comprising silicon carbide. The method 300 includes, at 310, disposing the first gate resistor 15 on the gate terminal 35 of the semiconductor device 12. In non-limiting aspects, the first gate resistor 15 can be formed in place (i.e., on the first gate terminal first side 35a a direct writing process. In some non-limiting aspects, the gate terminal 35 can mechanically support the first gate resistor 15. The first gate resistor 15 in non-limiting aspects, can thus be disposed in direct contact with the gate terminal 35 and external to the semiconductor device body 13. The method 300 can include, at 320, electrically insulating the gate terminal 35 from a source terminal 34 of the semiconductor device 12 by way of a dielectric layer 24. The method 300 can further include, at 330, defining a second gate resistor 150 spaced from the gate terminal 35. For example, in non-limiting aspects, the second gate resistor 150 can be formed by way of a direct write application. In non-limiting aspects, the second gate resistor 150 can be disposed on the dielectric layer first side 24a). The method 300 can include, at 340, electrically coupling the second gate resistor 150 in series with the first gate resistor 15 via a first conductive line 151. In non-limiting aspects, the metal interconnect layer 22 can be deposited on the dielectric layer 24 to define the first conductive line 151. In some non-limiting aspects, the second gate resistor 150 can define a segment of the first conductive line.

In non-limiting aspects, the semiconductor switching device 12 can further comprise a third gate resistor 152 defined within the semiconductor body 13 and electrically coupled in series with the gate terminal 35. While the present approach may be discussed herein in the context of SiC MOSFET devices, it should be appreciated the present approach may be applicable to other types of material systems (e.g., silicon (Si), germanium (Ge), aluminum nitride (AlN), gallium nitride (GaN), gallium arsenide (GaAs), diamond (C), or any other suitable semiconductor) as well as other types of device structures (e.g., UMOSFET, VMOSFETs, insulated gate bipolar transistors (IGBT), insulated base MOS-controlled thyristors (IBMCT), or any other suitable FET and/or MOS device) utilizing n-channel or p-channel designs.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims. Further aspects of the invention are provided by the subject matter of the following clauses:

1. A semiconductor device package comprising: a semiconductor switching device having a body, the body including a first side, and an opposing second side coupled to a substrate; a gate terminal defined on the semiconductor switching device body first side, the gate terminal having a first side, and an opposing second side facing the body; and a first gate resistor disposed on the gate terminal first side, the gate resistor coupled electrically in series with the gate terminal.

2. The semiconductor device package of the preceding clause, further comprising a dielectric layer having a first side, and an opposing second side facing the semiconductor switching device body first side, the dielectric layer defining an aperture therethrough.

3. The semiconductor device package of any preceding clause, further comprising a metal interconnect layer disposed on the dielectric layer first side and electrically coupled to the first gate resistor through the aperture.

4. The semiconductor device package of any preceding clause, wherein the first gate resistor is defined by way of a direct write application on the gate terminal first side.

5. The semiconductor device package of any preceding clause, further comprising a second gate resistor disposed on the dielectric layer first side, and spaced from the semiconductor switching device.

6. The semiconductor device package of any preceding clause, further comprising a first conductive line electrically coupling the first gate resistor and the second gate resistor in series.

7. The semiconductor device package of any preceding clause, wherein the second gate resistor defines a segment of the first conductive line.

8. The semiconductor device package of any preceding clause, wherein the second gate resistor is formed by way of a direct write application.

9. The semiconductor device package of any preceding clause, wherein the semiconductor switching device body comprises silicon carbide.

10. The semiconductor device package of any preceding clause, further comprising a third gate resistor defined within the semiconductor switching device body and electrically coupled in series with the gate terminal.

11. A method of forming a semiconductor device package comprising: disposing a first gate resistor on a gate terminal defined on a semiconductor switching device first side, the first gate resistor coupled electrically in series with the gate terminal.

12. The method of any preceding clause, further comprising disposing a dielectric layer having a first side, and an opposing second side facing the semiconductor switching device, the dielectric layer defining an aperture therethrough.

13. The method of any preceding clause, further comprising disposing a metal interconnect layer on the dielectric layer first side and electrically coupled to the first gate resistor through the aperture.

14. The method of any preceding clause, wherein the first gate resistor is disposed on the gate terminal by way of a direct write application.

15. The method of any preceding clause, further comprising disposing a second gate resistor on the dielectric layer first side, and spaced from the semiconductor switching device body.

16. The method of any preceding clause, wherein the metal interconnect layer defines a first conductive line electrically coupled to the first gate resistor and the second gate resistor in series.

17. The method of any preceding clause, wherein the second gate resistor defines a segment of the first conductive line.

18. The method of any preceding clause, wherein the second gate resistor is disposed by way of a direct write application.

19. The method of any preceding clause, wherein the semiconductor switching device body comprises silicon carbide.

20. The method of any preceding clause, wherein the semiconductor switching device body further comprises third gate resistor defined within the semiconductor switching device body and electrically coupled in series with the gate terminal.

What is claimed is:
1. A semiconductor device package comprising:
a semiconductor switching device having a body, the body including a first side, and an opposing second side coupled to a substrate;
a gate terminal defined on the semiconductor switching device body first side, the gate terminal having a first side, and an opposing second side facing the semiconductor switching device body; and
a first gate resistor disposed on the gate terminal first side, the gate resistor coupled electrically in series with the gate terminal.

2. The semiconductor device package of claim 1, further comprising a dielectric layer having a first side, and an opposing second side facing the semiconductor switching device body first side, the dielectric layer defining an aperture therethrough.

3. The semiconductor device package of claim 2, further comprising a metal interconnect layer disposed on the dielectric layer first side and electrically coupled to the first gate resistor through the aperture.

4. The semiconductor device package of claim 3, further comprising a second gate resistor disposed on the dielectric layer first side, and spaced from the semiconductor switching device.

5. The semiconductor device package of claim 4, further comprising a first conductive line electrically coupling the first gate resistor and the second gate resistor in series.

6. The semiconductor device package of claim 5, wherein the second gate resistor defines a segment of the first conductive line.

7. The semiconductor device package of claim 4, wherein the second gate resistor is disposed by way of a direct write application.

8. The semiconductor device package of claim 1, wherein the first gate resistor is defined by way of a direct write application on the gate terminal first side.

9. The semiconductor device package of claim 1, wherein the semiconductor switching device body comprises silicon carbide.

10. The semiconductor device package of claim 9, further comprising a third gate resistor defined within the semiconductor device body and electrically coupled in series with the gate terminal.

11. A method of forming a semiconductor device package comprising:
disposing a first gate resistor on a first side of a gate terminal, the gate terminal having a second side opposing the first side, the second side coupled to a first side of a semiconductor switching device body;
coupling the first gate resistor coupled electrically in series with the gate terminal; and
coupling a second side of the switching device body to a substrate.

12. The method of claim 11, further comprising disposing a dielectric layer having a first side, and an opposing second side facing the semiconductor switching device, the dielectric layer defining an aperture therethrough.

13. The method of claim 12, further comprising disposing a metal interconnect layer on the dielectric layer first side and electrically coupled to the first gate resistor through the aperture.

14. The method of claim 13, further comprising disposing a second gate resistor on the dielectric layer first side, and spaced from the semiconductor switching device body.

15. The method of claim 14, wherein the metal interconnect layer defines a first conductive line electrically coupled to the first gate resistor and the second gate resistor in series.

16. The method of claim 15, wherein the second gate resistor defines a segment of the first conductive line.

17. The method of claim 14, wherein the second gate resistor is disposed by way of a direct write application.

18. The method of claim 11, wherein the first gate resistor is disposed on the gate terminal by way of a direct write application.

19. The method of claim 11, wherein the semiconductor switching device body comprises silicon carbide.

20. The method of claim 19, wherein the semiconductor switching device body further comprises a third gate resistor defined within the semiconductor switching device body and electrically coupled in series with the gate terminal.

* * * * *